POSITIONING MECHANISM CONTROL AND SWITCHING

Filed Feb. 12, 1963 3 Sheets-Sheet 1

Inventors
JEAN M. P. LISIMAQUE
RENE DELLESMILLIERES
By [signature]
Attorney

POSITIONING MECHANISM CONTROL AND SWITCHING

Filed Feb. 12, 1963 3 Sheets-Sheet 2

Inventors
JEAN M. P. LISIMAQUE
RENE DELLESMILLIERES
By [signature]
Attorney

Inventors
JEAN M. P. LISIMAQUE
RENE DELLESMILLIERES
By [signature]
Attorney

United States Patent Office 3,208,018
Patented Sept. 21, 1965

3,208,018
POSITIONING MECHANISM CONTROL AND SWITCHING

Jean M. P. Lisimaque and René Dellesmillieres, Boulogne-Billancourt, France, assignors to International Standard Electric Corporation, New York, N.Y., a corporation of Delaware Filed Feb. 12, 1963, Ser. No. 257,950
Claims priority, application France, Feb. 14, 1962, 888,023, Patent 1,322,271
11 Claims. (Cl. 334—7)

This invention relates to a positioning mechanism for frequency control and switching in a radio apparatus. This invention is applied more particularly to a frequency switching mechanism for a transmitter-receiver set.

In an amplifier, a filter, an oscillator or any device wherein radio circuits have to be tuned with accuracy to a frequency F chosen from a wide operating range covering several octaves of a minimum frequency, which devices include reactive and capacitive elements, several known methods are provided for continuously varying the tuning of these circuits. For instance, a variable condenser may be associated with a fixed reactance, or a fixed condenser may be associated with a veriable inductance which is varied by displacement of a tuning slug inside a winding. Furthermore, the operating range often has to be divided into several subranges. Inside each subrange, the condenser is fixed and the reactance is variable (or vice versa) and in order to change the subrange, another fixed value is given to the fixed element.

When very fine tuning is desired, it is generally advantageous to utilize linear angular control condensers or tuning slug inductances the windings of which are such that the tuning frequency of the circuit varies linearly according to the displacement of a tuning slug. This linearity is maintained in a frequency band corresponding to at least one subrange. For instance, the ratio of maximum frequency to minimum frequency may be 1.5 or 2.

It is an object of our invention to provide a positioning mechanism for serving as a mechanical intermediary between the tuning slugs of frequency linear varying inductances and the decimal display knobs of the apparatus comprising the circuits to be tuned.

The positioning mechanism is able to obtain a harmonic transformation from a rotational movement to a rectilinear movement, i.e. it causes a rotational displacement to correspond to a proportional rectilinear displacement, the proportionality factor and the displacement starting-point varying in a discrete manner. When applying this transformation to the frequency switching for telecommunication apparatus, the rotation of several knobs are transformed into a proportional rectilinear displacement of slugs into and out of their respective inductance coils.

Mechanical devices are known in which the link between the said display knobs and the tuning slugs is effected by means of $\frac{1}{10}$ ratio gear train linking the various axes of control knobs with a wheel and endless rack device in order to transform the rotational movement into a translational movement. These devices have many drawbacks. For instance, they do not lend themselves to the extension of tuning in several subranges, the controls are not reversible due to the great demultiplication ratio, and the continuous rotation of all the axes tends to result in unreliable readings.

Devices are also known in which the link between the display knobs and the tuning slugs is effective by means of a positioning servomechanism comprising a motor capable of displacing the tuning slugs by means of a toothed wheel and an endless rack, said motor being controlled by a conventional arrangement, for instance potentiometers mounted in a Wheatstone bridge arrangement associated with error amplifiers and switching relays. The drawbacks of these arrangements is the complexity of the circuitry, the energy demand, the accuracy required in the resistors and potentiometers, the lubrication difficulties at low temperatures, and particularly the delay required for the operation of the servomechanism which is dependent upon the operational accuracy required and may be as much from thirty seconds to a minute.

One object of our invention is to provide a mechanical linking device which does not involve the above-mentioned drawbacks, and which provides a control apparatus which requires a small space, is light weight, and which may be utilized by non-skilled personnel. Our device is particularly useful in a radiotelecommunication portable transmitter-receiver.

It is another object of our invention to provide inexpensive and simple means for accurately moving an object desired distances in a rectilinear manner by discreet rotational movements.

According to one feature of our invention, there is provided a mechanical positioning mechanism comprising a first carriage capable of being actuated by a translational movement when driven and pushed by a cam linked to a display knob, the movement of said first carriage being transmitted by means of a lever to a second carriage bearing the object or objects to be positioned in such a way that the object or objects are moved parallel to the movement of the first carriage, said lever of varying effective length being able to rotate around one axis selected amongst a plurality of axes having different positions in the perpendicular as well as parallel direction to the carriages in order to obtain means positions and different transmitting ratios. The axes are slidably mounted in a bearing and resiliently maintained out of the movement plane of said lever which is on one side of the bearing. The selected axis is partly pushed out of the bearing by an axis selector (or a subrange selector) comprising a plurality of levers arranged on the opposite side of the bearing and cam means operating a desired lever to push out the selected axis. The cam means is driven by the subrange selecting shaft which is controlled by the subrange connecting knob.

According to another feature of our invention, the first carriage of the above-mentioned positioning mechanism comprises two movably assemblies slidably mounted one within the other, the first assembly (slider) being pushed or driven by a first cam the axis of which is fixed in space and the second assembly being pushed or driven by a second cam whose axes is bound to the first slider so that the translational movement of the second assembly or slider is equal to the sum of the change in the radii of the two cams. In the same manner, said first carriage may comprise more than two sliders.

According to another feature of the invention, one end of the lever of the above-mentioned positioning mechanism can pivot about an axis coupled to one of the carriages whereas the other end of the lever has the form of an open slot, the slide-block of which is fixed to the other carriage in order to permit varying inclinations of the lever. When the first carriage of the positioning mechanism comprises two or more sliders, the lever is linked to the second or the last slider.

According to another feature of our invention, the lever of the above-mentioned positioning mechanism has one approximately straight longitudinal edge. The other edge is narrower in its center than at its ends, so that when this edge rests on the axis of the selected subrange, the three instantaneous axes of rotation of the lever with respect to the first carriage, the second or last carriage, and the subrange axis, are aligned.

Other features and advantages of our invention will become more apparent from the following description with reference to the accompanying drawings, in which:

FIGURE 1 represents a frequency-displacement characteristic of a tuning slug;

FIGURE 2 schematically represents several positions of a lever of our device in accordance with our invention;

Figure 4:
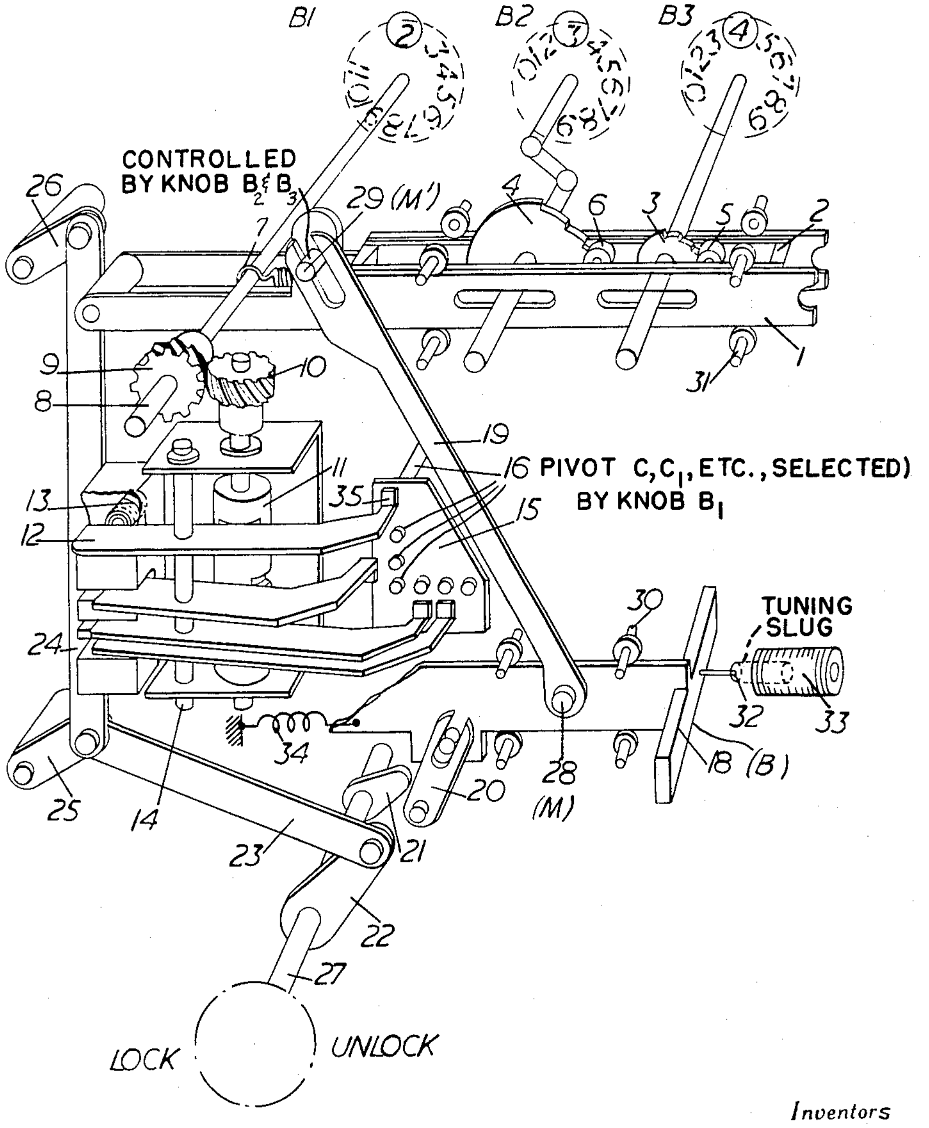

Referring now to FIG. 4, the mechanism consists of three knobs ($B_1$, $B_2$, and $B_3$), which are used to control the tuning of an inductor by moving a tuning slug 32 into a coil 33 to the desired depth. The heater of this mechanism is a lever 19, the upper end of which is positioned by knobs $B_2$ and $B_3$, and the lower end of which positions the tuning slug 32. In order to provide for different frequency ranges, knob $B_1$ rotates a shaft 8 which, in turn, rotates a rotary switch which connects condensers of different capacities across the tuning coil 33. In order to adjust the starting position of the tuning slug for the different ranges (to maintain linearity in the tuning—see FIG. 1), knob $B_1$ also controls the pivot 16 on which the lever 19 turns. Actually, there are a number of such pivots at different positions with respect to lever 19, and the particular pivot selected is determined by the position of knob $B_1$. The invention will now be described more specifically.

Figure 5:
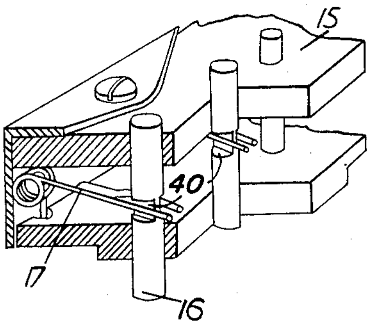
Figure 6:
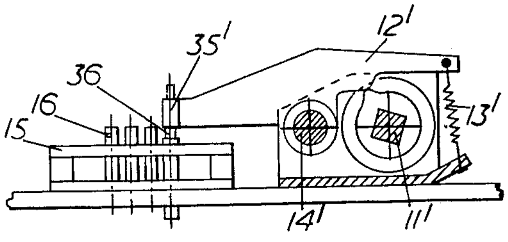

FIGURE 5 is a detailed view of the subrange axis slider utilized in the embodiment of FIGURE 4; and FIGURE 6 is a detailed view of an embodiment of the levers and camshaft controlling the subrange axes according to our invention.

Figure 1:
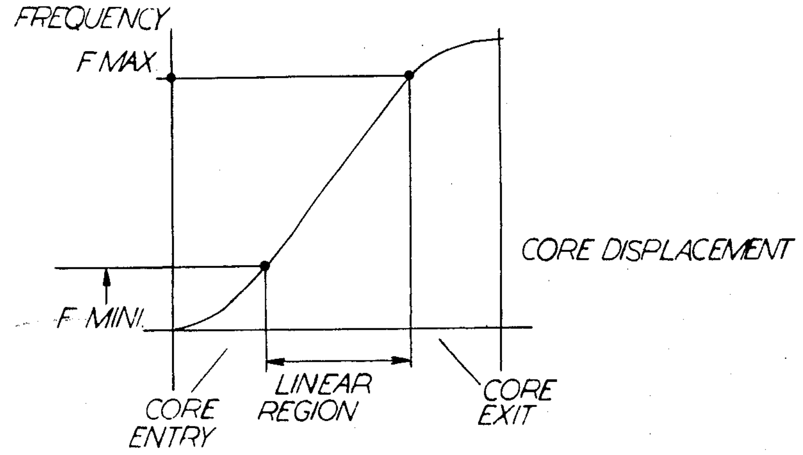

FIGURE 1 represents a frequency-displacement characteristic of a tuning slug of reactances of the type utilized in our invention which comprises a linear region between the core entry and core exit positions. The ratio of maximum frequency (F max) to minimum frequency (F min) of the linear region of the characteristic substantially varies from 2 to 1.5. For the purposes of this specification, it is assumed that the ratio max $F$/min $F$ is equal to 1.5.

Figure 2:
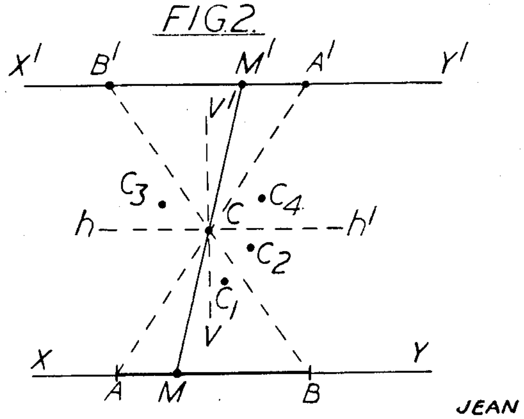

In the embodiment which will be hereinafter described, there is provided a direct mechanical positioning mechanism from display knobs having ten discrete positions allotted at regular intervals to the slugs of the reactances. The number of display knobs corresponds to the required degree of accuracy for positioning. By means of these knobs, a first translational movement is obtained by adding up the change in radii of two or several cams controlled by the knobs. This first movement causes carriage M to travel to a desired position between A and B on straight line XY of FIGURE 2. This first movement alone is sufficient for a frequency tuning range limited to the linear region of the tuning slug reactances, this region being, as mentioned above, rather limited. Consequently, the tuning range thus obtained is too narrow and it is therefore necessary to provide several subranges, the displacement of the tuning slugs being differently effected according to the different subranges selected.

Therefore the movement of the first carriage M from A to B is transmitted, according to our invention, by means of a lever of variable length MM′ and a subrange axis C, to a carriage M′ travelling from A′ to B′ on straight line X′Y′ parallel to XY. By displacing C on straight line *vv′* perpendicular to XY and X′Y′, the ratio of lengths of lever arms varies causing the same variation of ratio lengths AB to A′B′. By displacing C on line *hh′* parallel to XY and X′Y′, the position of the middle of segment A′B′ or the middle position of carriage M′ varies on X′Y′. Consequently, the position of point C and the movement of carriage M determines the position of carriage M′ which bears the tuning slugs.

The number of subranges being limited, it is sufficient to select, with the subrange display knob, one of the described axes shown $C_1$, $C_2$, $C_3$, $C_4$ . . . for the subrange axis. According to the invention, instead of moving axis C successively to points $C_1$, $C_2$, $C_3$, $C_4$ . . . when a subrange is selected, the axis is simply changed, i.e., axis $C_1$ or $C_2$ is selected, etc. The possible error in positioning axis C is then minimal, and allows a higher accuracy in the positioning of carriage M′.

By way of example, it will be assumed that the complete operating frequency range of a radiotelecommunication apparatus is comprised between 2 and 12 mc. and the tuning is effected through three display knobs $B_1$, $B_2$, and $B_3$ indicating, respectively megacycles, hundreds of kilocycles, and tens of kilocycles. These knobs operate rotary switches to which they are linked by shafts. The switches have positions regularly displaced, for instance by 30°, and are maintained in a selected one of the positions by a locking device. These positions are numbered on knobs $B_1$, $B_2$, and $B_3$ in FIGURE 4.

Figure 3A:
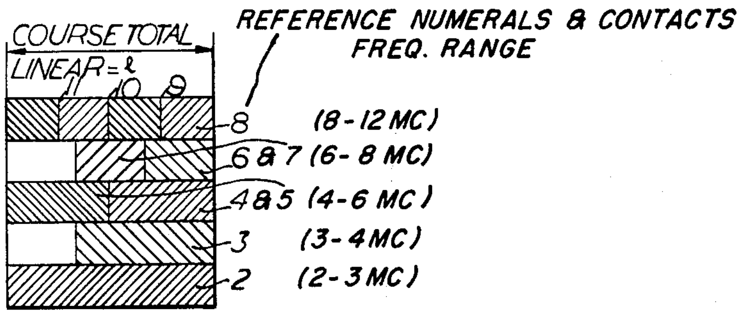
FIG. 3A represents a stroke diagram illustrating the distance the tuning slug travels through each subrange.
Figure 3B:
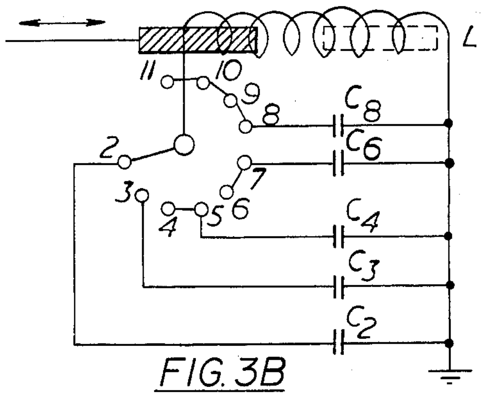
FIG. 3B illustrates schematically a tuning circuit for several subranges.

The movement of shaft 8 by knob $B_1$ also moves a rotary switch (FIGURE 3B) which connects reactance L when it is moved to reference mark 2 of knob $B_1$ (see numerals on face of knob B, and in FIG. 4) to condenser $C_2$ when it is moved to reference mark 3 to condenser $C_3$, to reference marks 4 and 5 to condenser $C_4$, to reference marks 6 and 7 to condenser $C_6$ and to reference marks 8 through 11 to condenser $C_8$. The values of condensers $C_2$, $C_3$, $C_4$, $C_6$ and $C_8$ are chosen so that the range of 2–12 mc. is divided into five subranges in which the ratio of maximum frequency to minimum frequency is always equal or inferior to 1.5 as allowed by the characteristic of reactance L. For instance (FIGURE 3A), the first subrange extends from 2 to 3 mc. with $$\frac{\text{max. } F}{\text{min. } F}=1.5$$

the second from 3 to 4 mc. with $$\frac{\text{max. } F}{\text{min. } F}=1.33$$

the third from 4 to 6 mc., the fourth from 6 to 8 mc. and the fifth from 8 to 12 mc. If it is desired that the starting points of the five subranges coincide as to the value of the reactive element, the condensers, in this case, will be defined by the relation $$C=\frac{1}{4\pi^2 L}\times\frac{1}{F^2}$$

F being the low frequency of the subranges, the tuning slugs being completely going in. There will be thus obtained $$C_3=C_2\times\frac{4}{9},\ C_4=\frac{C_2}{4},\ C_6=\frac{C_2}{9},\ C_8=\frac{C_2}{16}$$

It will be equally seen that in the subranges 2 and 4, the ratio between the extreme frequencies is 4/3 instead of 3/2. The complete travels of the slugs in these subranges are reduced in the proportion:

$$\frac{F\times\frac{4}{3}-F}{F\times\frac{3}{2}-F}=\frac{2}{3}$$

Furthermore, the resolution of the travel corresponding to subranges 3 and 4 into two equal parts of each 1 mc. and the resolution of the complete travel of the fifth subrange into four equal parts, involves for the display of 5, 7, 9, 10, 11 mc. on knob $B_1$ the modification of the starting point of the travel of the tuning slugs, the ratio of lever arms remaining unchanged. In our inventive arrangement the horizontal position of the axis chosen determines (line *h′h*, FIGURE 2) the starting points, the vertical position of the axis chosen determines the proportional movement of M with respect to M′, and the rotary switch connects the correct capacitor into the circuit. As explained, the proportional movement of M with respect to M' must be varied at different megacycles as the slug must be moved different distances to obtain the same frequency variation at different levels.

The above-mentioned implications now perimt to describe in detail an embodiment of the positioning mechanism according to our invention, in connection with FIGURE 4. Axis 8 is controlled by knob $B_1$. Cam 4 is controlled by knob $B_2$. Cam 3 is controlled by knob $B_3$. Cam 4 is designed to act on roller 6 with ten different radii corresponding to ten ball-locked positions of its axis. It is to be noted that the steps of cams 4 and 3, are spaced 30° apart. The ball-locking system may be of any kind and does not require any particular accuracy. The steps of cam 4 regularly vary in relation to one another by constant increments equal to $\frac{1}{10}$ of the complete travel of tuning slugs corresponding to the subrange 2–3 mc. Cam 3 is designed in the same way as cam 4 and coacts with roller 5, but its radii vary by constant increments which are equal to $\frac{1}{100}$ of the complete travel of the tuning slugs.

The axis of cam 3 is rotatably connected to the frame (not shown). The axis of cam 4 may travel in a perpendicular direction to itself, by means of a flexible joint or Oldham joint arrangement, for the total travel of the maximum change in the radii of cam 3, i.e.

$$10\times\frac{1}{100}=\frac{1}{10}$$

of the complete travel of slugs. Rollers 5 and 6 are respectively associated with ball sliders or carriages 1 and 2. The mobile axes of cam 4 and roller 5 are connected to carriage 2. Roller 6 is connected to carriage 1.

Carriage 1 is slidably mounted between rollers 31, and resiliently pressed against cams 3 and 4 by spring 7. The total movement of carriage 1 may be determined by adding the change in radii of two cams 3 and 4 where rollers 5 and 6 contact them when knobs $B_2$ and/or $B_3$ are turned. In this manner, the first movement represented in AB on FIGURE 2, and corresponding in this case to a frequency displacement from 2 to 2.99 mc. (every 10 kc.), is therefore obtained. The addition of a third cam could increase the positioning accuracy to kilocycles if this is needed.

The first movement of carriage 1 is transmitted to carriage 18 mounted between rollers 30, in a parallel direction to carriage 1, through lever 19 hinged on pivot 28 of carriage 18 and pivot 29 of carriage 1. Carriage 18 carries the tuning slug or slugs such as 32 which are to be moved in and out of their respective cores 33. The latter hinge is made in the form of an open slot in order to permit the lever to be moved on axis 16 by spring 34 which is connected to carriage 18. The shape of lever 19 is such that the centers of axes 28, 16 and 29, assumed to be cut in the plane of lever 19 are aligned. This condition is essential in order that the accuracy of the system be maintained whatever the angle of lever 19 may be.

According to another feature of the invention, the bearing of the subrange axes is composed of two similar metallic plates 15 (see FIG. 5), maintained parallel by fastening means 17; said plates being bored so that each hole in a plate is opposite to a hole in the other plate thus defining the bearings of the subrange axes. The axes comprise, in their center, throttlings 40 to which are hooked the return-springs 17 positioned in the space between the two plates of the bearing and attached to the plates. The subrange axes, such as axis 16, the number of which is equal to the number of positions of the mc control knob $B_2$ (10 positions from 2 to 12), slide perpendicular to the lever plane and are guided by bearings provided in the two parallel plates of guide 15. Springs such as 17 restore said axes to their normal position when they are released by the tipper which causes them to coact with lever 19 (see FIGURE 5).

All the centers of axes corresponding to the same subrange are aligned in a straight line parallel to carriages 1 and 18. The centers of axes corresponding to the same starting points of slugs for different subrange are on the same vertical line if the lever is vertical, or on the same oblique line if the lever is oblique for the position corresponding to this starting point.

The axes are selected according to the display of knob $B_1$ in the following manner. Axis 8 integral with knob $B_1$, drives camshaft 11 by means of gears 9 and 10. Levers or tippers 12 rest on cam 11 and are able to rotate about axis 14, the pressure on the cam being controlled by screw springs 13. Cam 11 consists of a cylinder having milled flats fillings 30° of an arc and displaced by 30° from each other; each time the axis 8 is ball-locked on a display position, one of the levers 12 rests on a flat of cam 11 and pushes the subrange axis associated with it. An accurate selector system is easily achieved as this system operates an axis or it does not. Thus the components which constitute it may be machine-finished with rather large tolerances.

According to another feature of the invention, the link between a subrange axis and the tipper intended for pushing it is made by flattening the end of the tipper in order that said flattened end may have a sliding contact with the extremity opposite to the subrange axis.

The sole components affecting the accuracy of the final movement are: cams 3 and 4, lever 19, axes bearing block 15 and, subrange axes which are all easy to manufacture. On the other hand, all the hand-operated components, (knobs) are moved slowly and may be designed so that no lubrication is needed, thus permitting the utilization of our apparatus at any ambient temperature without special precautions.

Another advantage of our system is the fact that the mechanical backlash is eliminated by the action of springs 7 and 34. Otherwise vibrations or shocks could cause mechanical oscillations of carriages 18 and 1. If the system has to be operated on a vehicle, it will be necessary to add a blocking system for the carriages when the apparatus is ready for starting.

According to another feature of the invention, there is provided a locking and unlocking system comprising rods 23 and 24, cranks 22, 25 and 26 and springs 7 and 34 which, at the time of display of the different display knobs, removes to a distance the unit constituted by the two carriages and the guide lever, as defined above, in order that the subrange display, i.e. the departure of a subrange axis, is not prevented or hindered by the lever. The locking and unlocking may be efficiently affected by a set of cams jamming flexible plates integral with carriages on a fixed part integral with the frame, or by any device which does not exert any longitudinal stress on the carriages when the locking is effected.

It is necessary, at the time of display through knobs $B_1$, $B_2$, $B_3$, to push the two carriages thoroughly to the right, for the following reasons:

(1) Lever 19 has to be entirely disengaged from axis block 15 when said axes are selected by the selecting system.

(2) Cams 3 and 4, according to their size and the quantities of which their radii vary from one position to another, can be irreversible. Therefore, guides 6 and 5 should be disengaged from the cams for rotating them free from one position to their start or another position.

This movement is effected by axis 27 bearing a "locking-unlocking" operating knob which actuates carriage 18 through cam 21 and lever 20; and carriage 1 by means of a parallelogram constituted by rods 24, 25, 26 and rod 23. Axis 27 is utilized at the same time to effect the locking of carriages, as mentioned above.

The additional functions of locking and unlocking the carriages and cams may be also used for actuating supplementary radioelectric safety devices, for instance the high voltage switching-off on the output stage of a transmitter at the time of circuit switching or any other service.

FIGURE 6 represents another embodiment of the tippers and camshaft controlling the subrange axes. While camshaft 11 of FIGURE 4 does not fulfill any motive part in the operation of tippers 12 which are actuated by springs 13, camshaft 11' of FIGURE 6 pushes the selected tipper 12' which pushes the selected axis 16, springs 13' being only return springs. This arrangement has several advantages in that springs 13' are weaker than springs 13, camshaft 11' and pivoting shaft 14' of tippers, support much less stress than do shafts 11 and 14, respectively.

According to another feature of our invention, the extremity 35' of tipper 12', has the form of a cylinder which has been, for instance, produced by brazing the end of tipper 12'. Said cylinder is tapped and holds screw 36, the head of which is in contact with the end axis 16. The other end of screw 36 is slotted in order to permit its adjustment and consequently the allowed clearances between 36 and 16 on the one hand, and 12' and 11' on the other hand.

While the principles of our invention have been described above in connection with specific embodiments and particular modifications thereof, it is to be clearly understood that this description is made only by way of example and not as a limitation on the scope of our invention.

We claim:

1. A broadband frequency selector comprising:

a plurality of capacitors, each of which corresponds to a subrange of the frequency band;

a variable inductor having a movable core;

subrange selector means for connecting a desired one of said capacitors in series with said variable inductor;

guding means for causing said core to move along a path relative to the windings of said variable inductor;

starting means coacting with said subrange selecting means to position said core at the point on said path which corresponds to the starting frequency of the subrange selected;

frequency selector means for selecting a desired frequency within said selected subrange coacting with said core to move said core a proportional distance, for the subrange selected, in relation to the operation of said frequency selector means; and factor means cooperating with said subrange selector means to determine the proportional movement of said frequency selector means for the subrange selected;

said guiding means comprising means for mounting said movable core on a first carriage and means for slidably mounting said first carriage for rectilinear movement; and said starting means and said factor means comprising a second carriage which is slidably mounted for rectilinear movement parallel to said first carriage, a lever pivotally mounted in a plane perpendicular to both rectilinear paths and movably connected to said second carriage, a plurality of rods, means for resiliently mounting said rods perpendicular to and out of the movement plane of said lever, means for selectively moving a desired one of said rods into the movement plane of said lever, whereby the lateral position of said selected rod with respect to said rectilinear paths determines the starting position of said first carriage and the perpendicular distance of said rod between said first and second paths determines the fixed proportional movement of said core with respect to the operation of said frequency selector means.

2. A frequency selector according to claim 1 wherein said subrange selecting means comprises a dial, a shaft rotatably controlled by said dial, and a rotary switch controlled by said shaft for connecting a desired one of said capacitors in series with said variable inductor.

3. A frequency selector according to claim 2 wherein said starting means and said factor means further comprise a plurality of tippers, a cylindrical cam having flattened portions thereon spaced discrete distances apart around the periphery of said cam and spaced apart along the axis of said cam so that none of said flattened portions are circumferentially aligned with each other, means for pivotally mounting said tippers so that one end of each tipper is associated with one end of said rods, means for resiliently forcing said tippers against said cam whereby only one of said tippers can contact a flattened portion on said cam at a time, said tipper which contacts a flattened portion moving the rod associated with it into the movement plane of said lever.

4. A frequency selector according to claim 3 wherein said cam is rotatably mounted on a geared shaft and the movement of said geared shaft is controlled by the movement of said shaft which is controlled by said dial.

5. A frequency selector according to claim 4 wherein said means for resiliently mounting said rods comprises two parallel plates which are parallel to the movement plate of said lever, each of said plates having bearings therein which are coaxial with the bearings in the other plate, and spring means for resiliently retaining said rods out of the movement plane of said lever.

6. A frequency selector according to claim 4 further comprising means for causing said lever to engage with a rod which has been positioned in its movement plane and means for disengaging said lever from said rod.

7. A mechanical positioning device for accurately positioning an object comprising:

guide means for causing the object to move in a given path;

starting means for selectively starting the movement of said object at a desired one of a plurality of starting points on said given path;

selecting means for selectively choosing a desired one of a plurality of given units of distances; and moving means for selectively moving said object a desired number of said selected units;

said guide means comprising a first carriage, means for mounting said object on said first carriage, and means for slidably mounting said first carriage for rectilinear movement;

said moving means comprising a second carriage and means for slidably mounting said second carriage for rectilinear movement parallel to the movement of said first carriage, and a lever pivotally connected to said first carriage and movably connected to said second carriage; and said starting means and said selecting means comprising a plurality of rods, means for resiliently mounting said rods perpendicular to and out of the movement plane of said lever whereby said rods are perpendicular to said plane and to the paths of said first and second carriages, and means for selectively moving a desired one of said rods into the movement plane of said lever whereby the lateral position of said selected rod with respect to said rectilinear paths determines the starting position of said first carriage and the perpendicular distance of said rod between said first and second paths determines the fixed proportional movement of said core with respect to the operation of said frequency selector means.

8. A device according to claim 7 wherein said starting means and said factor means further comprise a plurality of tippers, a cylindrical cam having flattened portions thereon spaced discrete distances apart around the periphery of said cam and spaced apart along the axis of said cam so that none of said flattened portions are circumferentially aligned with each other, means for pivotally mounting said tippers so that one end of each tipper is associated with one end of said rods, means for resiliently forcing said tippers against said cam whereby only one of said tippers can contact a flattened portion on said cam at a time, said tipper which contacts a flattened portion moving the rod associated with it into the movement plane of said lever.

9. A device according to claim 8 wherein said cam is rotatably mounted on a geared shaft and the movement of said geared shaft is controlled by the movement of said shaft which is controlled by said dial.

10. A device according to claim 9 wherein said means for resiliently mounting said rods comprises two parallel plates which are parallel to the movement plate of said lever, each of said plates having bearings therein which are coaxial with the bearings in the other plate, and spring means for resiliently retaining said rods out of the movement plane of said lever.

11. A device according to claim 10 further comprising means for causing said lever to engage with a rod which has been positioned in its movement plane and means for disengaging said lever from said rod.

References Cited by the Examiner

UNITED STATES PATENTS

| | | | |
|---|---|---|---|
| 2,856,780 | 10/58 | Hemphill et al. | 334—70 |
| 2,892,031 | 6/59 | Arko et al. | 178—34 |
| 2,999,156 | 9/61 | Mason et al. | 334—69 |

FOREIGN PATENTS

| | | |
|---|---|---|
| 1,053,596 | 3/59 | Germany. |
| 1,112,149 | 8/61 | Germany. |

HERMAN KARL SAALBACH, *Primary Examiner.*